United States Patent [19]
Ko

[11] Patent Number: 6,117,788
[45] Date of Patent: *Sep. 12, 2000

[54] SEMICONDUCTOR ETCHING METHODS

[75] Inventor: Kei-Yu Ko, Meridian, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/145,491

[22] Filed: Sep. 1, 1998

[51] Int. Cl.$^7$ .............................................. H01L 21/3065
[52] U.S. Cl. ..................... 438/706; 710/723; 710/724; 710/729; 710/744
[58] Field of Search ................................... 438/706, 723, 438/729, 743, 724, 744, 720, 710

[56] References Cited

U.S. PATENT DOCUMENTS

| | | | |
|---|---|---|---|
| 4,753,709 | 6/1988 | Welch et al. | 156/643 |
| 4,990,229 | 2/1991 | Campbell et al. | 204/298.06 |
| 5,021,121 | 6/1991 | Groechel et al. | 156/643 |
| 5,022,958 | 6/1991 | Favreau et al. | 156/643 |
| 5,091,049 | 2/1992 | Campbell et al. | 156/643 |
| 5,286,344 | 2/1994 | Blalock et al. | 438/723 |
| 5,366,590 | 11/1994 | Kadomura | 156/662 |
| 5,397,962 | 3/1995 | Moslehi | 315/111.51 |
| 5,423,945 | 6/1995 | Marks et al. | 156/662.1 |
| 5,626,716 | 5/1997 | Bosch et al. | 438/723 |
| 5,639,519 | 6/1997 | Patrick et al. | 427/569 |
| 5,681,418 | 10/1997 | Ishimaru | 156/345 |
| 5,814,563 | 9/1998 | Ding et al. | 438/714 |
| 5,837,615 | 11/1998 | Rostoker | 438/711 |

*Primary Examiner*—Benjamin L. Utech
*Assistant Examiner*—Lynette T. Umez-Eronini
*Attorney, Agent, or Firm*—Wells, St. John, Roberts, Gregory & Matkin, P.S.

[57] ABSTRACT

Etching methods are described. In one embodiment, a first layer of first material is formed over a semiconductor substrate, and a second layer of second material is formed over the first layer. The second layer is selectively etched relative to the first layer, with the etching thereof taking place within a dual source, high density plasma etcher having a source powered at less than or equal to about 300 Watts, a bias power of less than or equal to about 300 Watts, and a pressure greater than or equal to about 10 mTorr. In another embodiment, a first undoped oxide layer is formed over a substrate, and a second doped oxide layer is formed over the first layer. The second doped oxide layer is etched selectively relative to the first undoped layer, with etching taking place within a dual source, high density plasma etcher wherein one of the sources is an inductive source powered at less than or equal to about 300 Watts. In yet another embodiment, a planar coil, high density plasma etcher is provided and etching takes place therein under conditions which are effective to etch the second layer of material at a rate of at least about 4,000 Angstrom/minute.

51 Claims, 4 Drawing Sheets

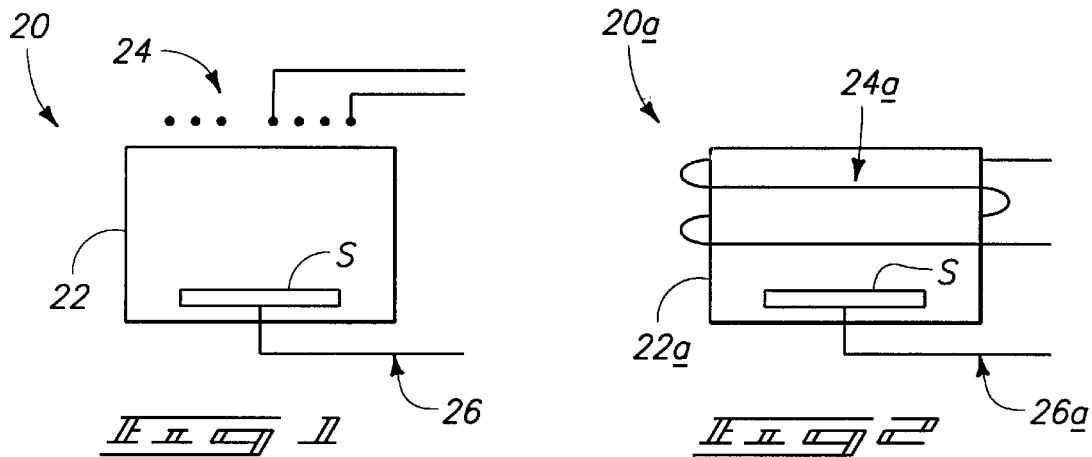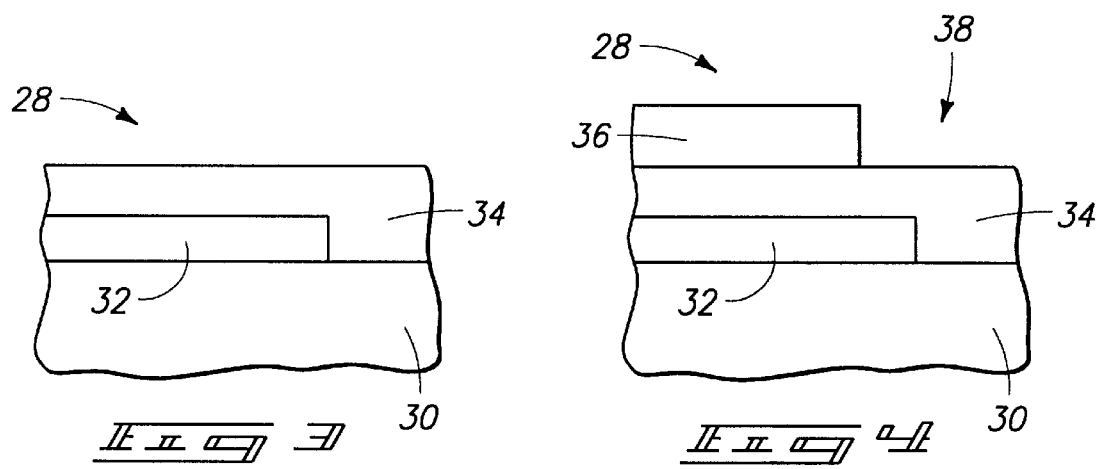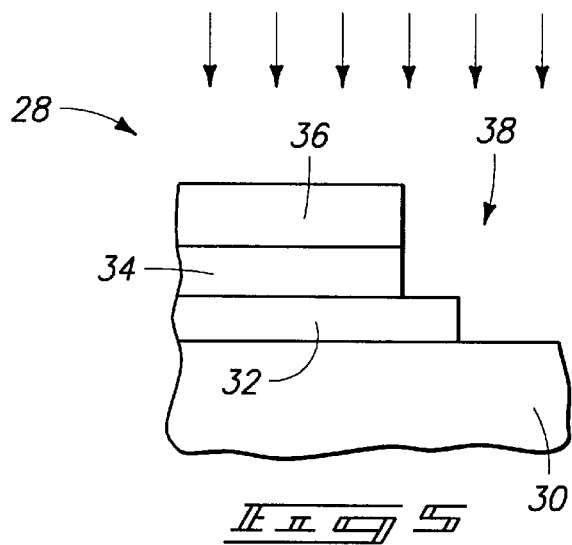

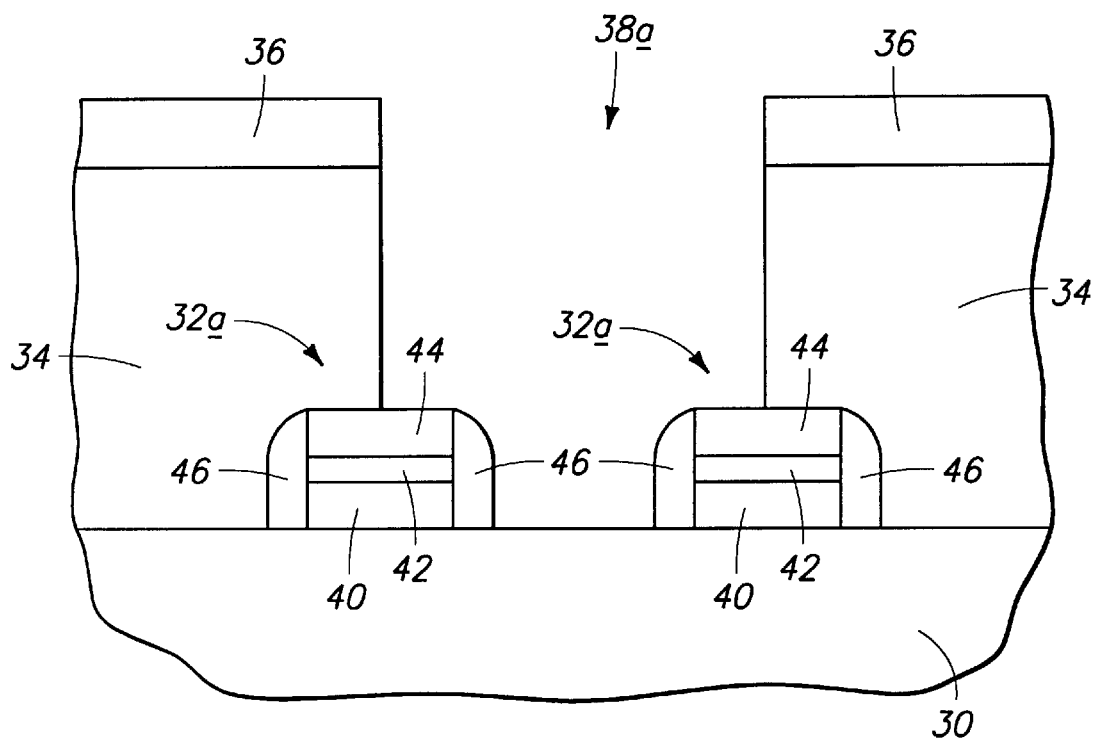
$\mathbb{F}\mathbb{I}\mathbb{G}$ 8
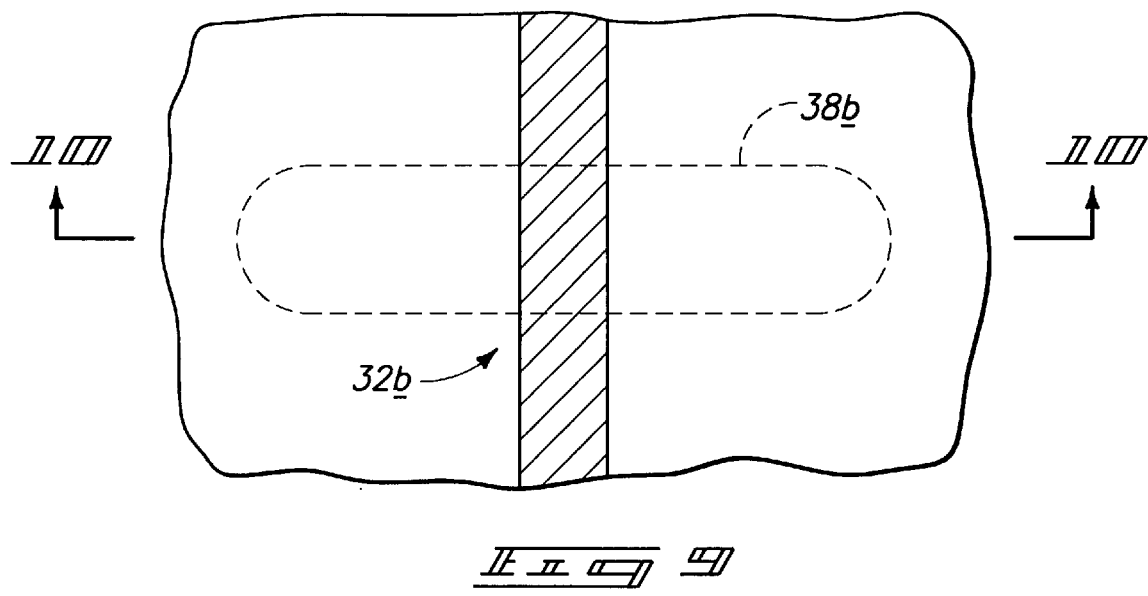
$\mathbb{F}\mathbb{I}\mathbb{G}$ 9

SEMICONDUCTOR ETCHING METHODS

TECHNICAL FIELD

This invention relates to etching methods.

BACKGROUND OF THE INVENTION

Semiconductor processing typically involves forming one or more layers of material over a substrate and etching the layers to define various substrate features. It is desirable in some instances to etch features which essentially self-align to other substrate features due to very high etch selectivity. This reduces the precision with which mask alignment must occur. Efforts are ongoing to improve the manner in which etching in semiconductor processing, and in particular, self-aligned etching is conducted.

This invention arose out of concerns associated with improving semiconductor etching methods, and in particular self-aligned etching.

SUMMARY OF THE INVENTION

Etching methods are described. In one embodiment, a first layer of first material is formed over a semiconductor substrate, and a second layer of second material is formed over the first layer. The second layer is selectively etched relative to the first layer, with the etching thereof taking place within a dual source, high density plasma etcher having a source powered at less than or equal to about 300 Watts, a bias power of less than or equal to about 300 Watts, and a pressure greater than or equal to about 10 mTorr. In another embodiment, a first undoped oxide layer is formed over a substrate, and a second doped oxide layer is formed over the first layer. The second doped oxide layer is etched selectively relative to the first undoped layer, with etching taking place within a dual source, high density plasma etcher wherein one of the sources is an inductive source powered at less than or equal to about 300 Watts. In yet another embodiment, a planar coil, high density plasma etcher is provided and etching takes place therein under conditions which are effective to etch the second layer of material at a rate of at least about 4,000 Angstrom/minute.

BRIEF DESCRIPTION OF THE DRAWINGS

Preferred embodiments of the invention are described below with reference to the following accompanying drawings.

FIG. 1 is a schematic diagram of a dual source, high density plasma etcher which can be utilized in implementing various embodiments of the invention.

FIG. 2 is a schematic diagram of a dual source, high density plasma etcher which can be utilized in implementing various embodiments of the invention.

FIG. 3 is a diagrammatic side sectional view of a semiconductor wafer fragment, in process, in accordance with one embodiment of the invention.

FIG. 4 is a view of the FIG. 3 wafer fragment at a processing step which is subsequent to that which is shown in FIG. 3.

FIG. 5 is a view of the FIG. 3 wafer fragment at a processing step which is subsequent to that which is shown in FIG. 4.

FIG. 8 is a view of the FIG. 6 wafer fragment at a processing step which is subsequent to that which is shown in FIG. 7.

FIG. 9 is a top plan view of a semiconductor wafer fragment in accordance with one or more embodiments of the invention.

DETAILED DESCRIPTION OF THE PREFERRED EMBODIMENTS

Figure 6:
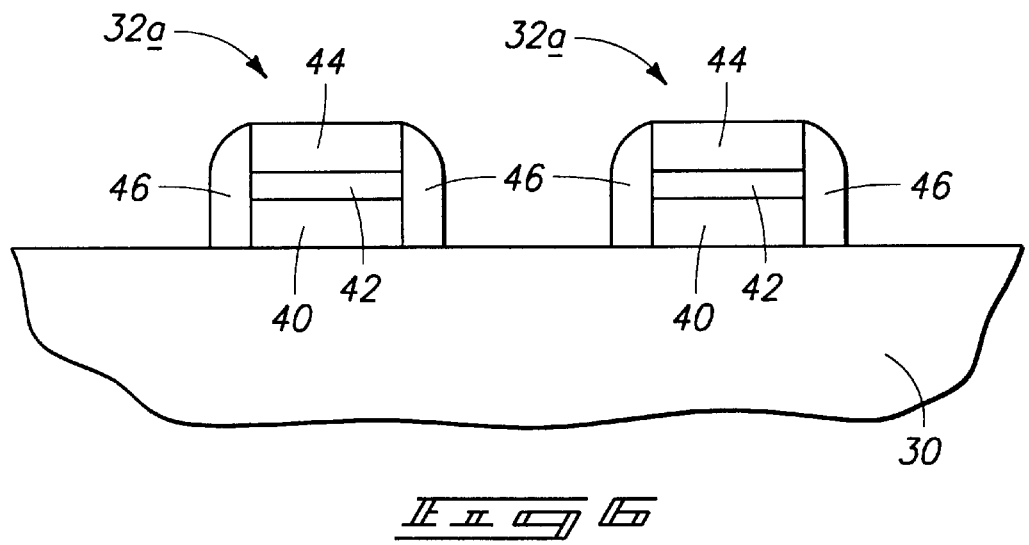
FIG. 6 is a diagrammatic side sectional view of a different wafer fragment, in process, in accordance with one or more embodiments of the invention.

This disclosure of the invention is submitted in furtherance of the constitutional purposes of the U.S. Patent Laws "to promote the progress of science and useful arts" (Article 1, Section 8).

Referring to FIGS. 1 and 2, two exemplary, different dual source, high density plasma etchers are shown generally at 20, 20a respectively, and can be utilized in implementing various methods of the invention. High density plasma etchers are understood to be those etchers in which, during typical etching operations, the plasma density has a concentration of $10^9 cm^{-3}$ or higher. Each etcher 20, 20a includes a chamber 22, 22a, respectively, and first and second sources 24, 24a and 26, 26a respectively. The sources provide power to the chamber for processing wafers therein. The first sources 24, 24a respectively, are inductive sources with source 24 (FIG. 1) comprising a generally planar coil, and source 24a (FIG. 2) comprising a generally non-planar coil. Second sources 26, 26a are commonly utilized to provide a bias power during etching of a substrate, such as substrates S which are positioned within the respective chambers.

The plasma etchers shown in FIGS. 1 and 2 constitute but two exemplary etcher constructions which can be utilized in implementing the various methods described just below. Accordingly, other plasma etchers can be utilized. Other etchers are described in a book entitled "Principles of Plasma Discharges and Materials Processing", which is authored by Lieberman and Lichtenberg. Still other etchers and the principles along which they work are described in U.S. Pat. Nos. 5,681,418, 5,397,962, 5,091,049, and U.S. Pat. No. 4,990,229, the disclosures of which are incorporated by reference.

Referring to FIGS. 3–5, first embodiments of the present invention are shown and described.

Referring to FIG. 3, a semiconductor wafer fragment 28 is provided and comprises a substrate 30. Substrate 30 can comprise any suitable material. A first layer 32 of first material is formed over substrate 30 and constitutes a substrate feature over the substrate. A second layer 34 of second material is formed over first layer 32 and constitutes an overlying layer of material. In one embodiment, the first and second layers comprise different materials. In another embodiment, the first and second layers comprise different oxide or oxide-comprising layers or materials. In yet another embodiment, the second layer comprises a doped oxide material, and the first layer comprises an undoped oxide material. For purposes of this discussion, "doped oxide" will be considered as oxide having a dopant concentration of three percent or more by weight, and "undoped oxide" will be considered as oxide having a dopant concentration of less than three percent by weight. Exemplary doped oxide materials include BPSG, PSG, and the like. Exemplary undoped oxide materials include undoped silicon dioxide. Exemplary different materials for first layer 32 also include various nitride materials such as silicon nitride. Referring to FIG. 4, a masking layer 36 is formed over substrate 30 and comprises an opening 38 through which material of layer 34 is to be removed.

Referring to FIG. 5, the substrate is exposed to etching conditions sufficient to etch the second layer selectively relative to the first layer. For purposes of the ongoing discussion, "selectively" will be understood to constitute an etch rate of at least 10:1. In a preferred embodiment, exposed portions of second layer 34 (FIG. 4) are selectively etched relative to first layer 32 within a dual source, high density plasma etcher, such as one of the dual source. high density plasma etchers shown and described in connection with FIGS. 1 and 2. In one dual source, high density plasma etcher embodiment, etching takes place with the source powered at less than or equal to about 300 Watts, a bias power of less than or equal to about 300 Watts, and a etcher pressure greater than or equal to about 10 mTorr. In another embodiment, the pressure is greater than 10 mTorr. In another dual source, high density plasma etcher embodiment, the source is powered from between about 100 Watts to 200 Watts. In another embodiment the bias power is greater than about 100 Watts. In another dual source, high density plasma etcher embodiment the pressure is less than about 20 mTorr. In another dual source, high density plasma etcher embodiment, bias power is provided from between about 100 Watts to 300 Watts, and etcher pressures can range from between about 10 mTorr to 20 mTorr. In another dual source, high density plasma etcher embodiment, the source is driven at a power less than about 200 Watts, and in connection with an etchant selected from a group of compounds comprising both hydrogen and fluorine. In a preferred embodiment, the etchant(s) or etch chemistry comprises $C_2HF_5$, $CHF_3$, and $CH_2F_2$, having a volume ratio of about 1:3:4. Plasma densities can be greater or less than $10^9 cm^{-3}$.

Figure 7:
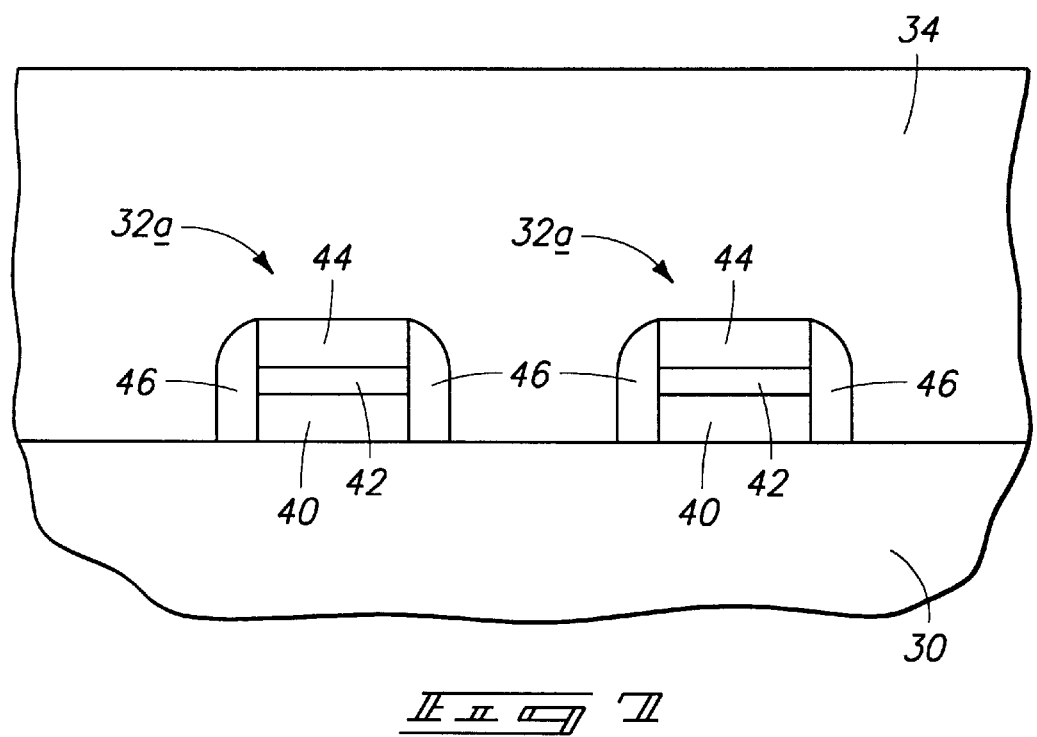
FIG. 7 is a view of the FIG. 6 wafer fragment at a processing step which is subsequent to that which is shown in FIG. 6.

Referring to FIGS. 6–8, other embodiments of the present invention are shown and described.

Referring to FIG. 6, a pair of substrate features 32*a* are formed over substrate 30. Like numerals from the above-described embodiment have been utilized where appropriate, with differences being indicated by the suffix "a" or with different numerals.

Substrate features 32*a* comprise, in this example, individual conductive lines having exemplary layers 40, 42, and 44. Layer 40 can comprise polysilicon, layer 42 can comprise a silicide material, and layer 44 can comprise an insulative material. Sidewall spacers 46 are provided over the conductive lines and can comprise the same insulative material that comprises layer 44. For purposes of the ongoing discussion, either or both of layers 44 and 46 can comprise a first layer of first material such as that described above in connection with FIGS. 3–5. In this example, layers 44 and/or 46 comprise outermost layers of the first material.

Referring to FIG. 7, a second layer 34 is formed over substrate 30 and substrate features 32*a*.

Referring to FIG. 8, a masking layer 36 is formed over the substrate, and an opening 38*a* is patterned over portions of substrate features 32*a*. Subsequently, material of layer 34 is selectively etched relative to first material 44, 46. Etching can, and preferably does take place utilizing the etchers and various processing parameters described above in connection with FIGS. 3–5.

Figure 10:
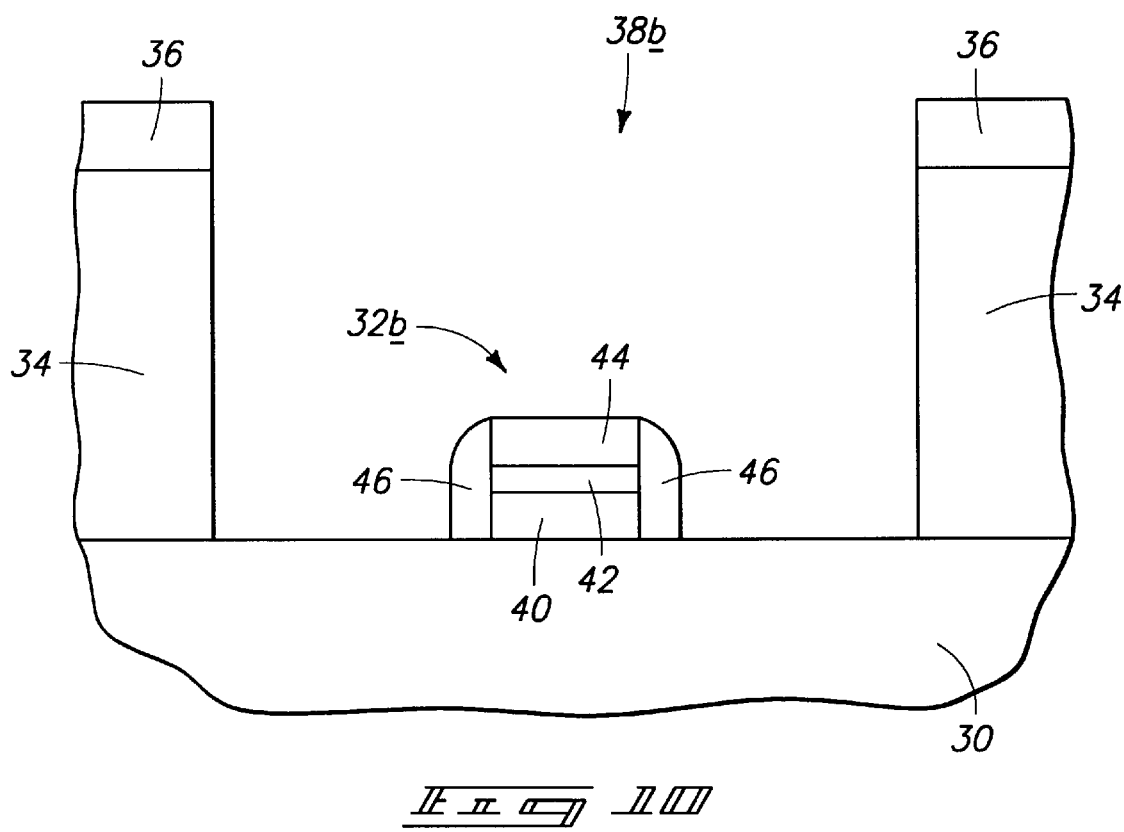
FIG. 10 is a view which is taken along line 10—10 in FIG. 9.

Referring to FIGS. 9 and 10, a substrate feature 32*b* is shown and comprises a conductive line similar to those described in connection with FIGS. 6–8. Like numerals from the above-described embodiment have been utilized where appropriate, with differences being indicated by the suffix "b" or with different numerals. A masking layer 36 is formed over substrate 30, and an opening 38*b* is patterned thereinto. Opening 38*b* has a dimension which is larger in area, than an area of substrate feature 32*b* which is to be exposed. Such can be seen in FIG. 9 where the boundary of the area of opening 38*b* is set off with a dashed line superimposed over substrate feature 32*b*. Second layer 34 is selectively etched through opening 38*b*. In this example, the etching of second layer 34 comprises forming a generally elongate trench received within layer 34.

Advantages of the above described methods can include improvements associated with self-aligned contact etches. Specifically, the methods can allow self-aligned contact etches to be conducted on various types of features including contact holes, slots, and trenches at the same time. This can allow the designs of various structures on the same mask levels, and can result in the reduction of certain mask levels. Other advantages will be understood by those of skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An etching method comprising:

forming a first layer of first material over a semiconductor substrate;

forming a second layer of second material over the first layer; and etching the second layer selectively relative to the first layer, the etching comprising etching within a dual source, high density plasma etcher having a source powered at less than or equal to about 300 Watts, a bias power of less than or equal to about 300 Watts, and a pressure greater than or equal to about 10 mTorr.

2. The etching method of claim 1, wherein the pressure is greater than 10 mTorr.

3. The etching method of claim 1, wherein the source is powered from between about 100 Watts to 200 Watts.

4. The etching method of claim 1, wherein the bias power is greater than about 100 Watts.

5. The etching method of claim 1, wherein the pressure is less than about 20 mTorr.

6. The etching method of claim 1, wherein:

the source is powered from between about 100 Watts to 200 Watts; and the bias power is greater than about 100 Watts.

7. The etching method of claim 1, wherein:

the source is powered from between about 100 Watts to 200 Watts;

the bias power is greater than about 100 Watts; and the pressure is less than about 20 mTorr.

8. The etching method of claim 1, wherein the forming of the second layer of second material comprises forming a layer comprising doped oxide over the first layer.

9. The etching method of claim 1, wherein:

the forming of the first layer of first material comprises forming a layer comprising undoped oxide over the substrate; and the forming of the second layer of second material comprises forming a layer comprising doped oxide over the first layer.

10. The etching method of claim 8 wherein the etching of the second layer of second material comprises using an etch chemistry comprising $C_2HF_5$, $CHF_3$, and $CH_2F_2$.

11. The etching method of claim 8 wherein the etching of the second layer of second material comprises using an etch chemistry comprising $C_2HF_5$, $CHF_3$, and $CH_2F_2$ having a volume ratio of about 1:3:4.

12. The etching method of claim 9 wherein the etching of the second layer of second material comprises using an etch chemistry comprising $C_2HF_5$, $CHF_3$, and $CH_2F_2$.

13. The etching method of claim 9 wherein the etching of the second layer of second material comprises using an etch chemistry comprising $C_2HF_5$, $CHF_3$, and $CH_2F_2$ having a volume ratio of about 1:3:4.

14. The etching method of claim 1 wherein the first material comprises a nitride material.

15. The etching method of claim 14 wherein the nitride material comprises silicon nitride.

16. The etching method of claim 1 wherein the first material comprises a nitride material, and the second material comprises doped oxide.

17. A The etching method of claim 16 wherein the nitride material comprises silicon nitride.

18. The etching method of claim 16 wherein the etching of the second layer of second material comprises using an etch chemistry comprising $C_2HF_5$, $CHF_3$, and $CH_2F_2$.

19. The etching method of claim 10 wherein the etching of the second layer of second material comprises using an etch chemistry comprising $C_2HF_5$, $CHF_3$, and $CH_2F_2$ having a volume ratio of about 1:3:4.

20. An etching method comprising:
   forming a first undoped oxide layer over a substrate;
   forming a second doped oxide layer over the first undoped oxide layer; and
   etching the second doped oxide layer selectively relative to the first undoped oxide layer, the etching comprising etching within a dual source, high density plasma etcher, one of the sources being an inductive source which is powered at less than or equal to about 300 Watts, and a bias power of less than or equal to about 300 Watts.

21. The etching method of claim 20, wherein the inductive source comprises a generally planar coil.

22. The etching method of claim 20, wherein the inductive source comprises a generally non-planar coil.

23. The etching method of claim 20 further comprising conducting the etching at an etcher pressure of greater or equal to about 10 mTorr.

24. The etching method of claim 20 further comprising conducting the etching at etcher pressures from between about 10 mTorr to 20 mTorr.

25. The etching method of claim 20, wherein the source is powered from between about 100 Watts to 200 Watts.

26. The etching method of claim 20, wherein the bias power is greater than about 100 Watts.

27. The etching method of claim 20, wherein:
   the source is powered from between about 100 Watts to 200 Watts; and
   the bias power is greater than about 100 Watts.

28. The etching method of claim 20 wherein the etching of the second doped oxide layer comprises using an etch chemistry comprising $C_2HF_5$, $CHF_3$, and $CH_2F_2$.

29. The etching method of claim 20 wherein the etching of the second doped oxide layer comprises using an etch chemistry comprising $C_2HF_5$, $CHF_3$, and $CH_2F_2$ having a volume ratio of about 1:3:4.

30. An etching method comprising:
   providing a planar coil, high density plasma etcher having a substrate positioned therein, the substrate comprising a first layer and a second layer over the first layer, the first layer comprising first material and the second layer comprising doped oxide, the first layer being different from doped oxide; and
   exposing the substrate to etching conditions sufficient to etch the second layer selectively relative to the first layer, the etching conditions comprising powering the planar coil at a power less than or equal to about 300 Watts and under conditions effective to etch the second layer at a rate of at least about 4000 Angstrom/minute, the etching conditions comprising using an etch chemistry comprising $C_2HF_5$, $CHF_3$, and $CH_2F_2$.

31. The etching method of claim 30, wherein the first layer comprises an oxide material.

32. The etching method of claim 30 wherein the etching conditions comprise using an etch chemistry comprising $C_2HF_5$, $CHF_3$, and $CH_2F_2$ having a volume ratio of about 1:3:4.

33. An etching method comprising:
   providing a planar coil, high density plasma etcher having a substrate positioned therein, the substrate comprising a first layer and a second layer over the first layer, the first layer comprising a nitride material; and
   exposing the substrate to etching conditions sufficient to etch the second layer selectively relative to the first layer, the etching conditions comprising powering the planar coil at a power less than or equal to about 300 Watts and under conditions effective to etch the second layer at a rate of at least about 4000 Angstrom/minute, the etching conditions comprising using an etch chemistry comprising $C_2HF_5$, $CHF_3$, and $CH_2F_2$.

34. The etching method of claim 33 wherein the nitride material comprises silicon nitride.

35. Ah etching method comprising:
   forming a substrate feature over a substrate, the feature having a portion which is to be exposed by etching an overlying layer of material;
   forming an overlying layer of material over the substrate feature;
   patterning an opening over the substrate feature portion, the opening having a dimension which is larger in area than an area of the feature portion which is to be exposed;
   selectively etching the layer of material through the opening relative to material from which the feature is formed, the etching comprising using a dual source, high density plasma etcher having:
      a planar inductive coil powered at no greater than about 300 Watts;
      a bias power no greater than about 300 Watts; and
      an etcher pressure from between about 10 mTorr to 20 mTorr.

36. The etching method of claim 35, wherein the etching of the layer of material comprises forming a generally elongate trench received within the layer of material.

37. The etching method of claim 35, wherein:
   the forming of the substrate feature comprises forming the feature to have an outermost layer comprising a first material; and
   the forming of the overlying layer of material comprises forming a layer which is different from the first material and which comprises doped oxide.

38. The etching method of claim 35, wherein:
the forming of the substrate feature comprises forming the feature to have an outermost layer comprising a first material;
the forming of the overlying layer of material comprises forming a layer which is different from the first material and which comprises doped oxide; and
the etching of the layer of material comprises forming a generally elongate trench received within the layer of material.

39. The etching method of claim 35, wherein:
the forming of the substrate feature comprises forming a layer comprising undoped oxide; and
the forming of the overlying layer of material comprises forming a layer comprising doped oxide.

40. The etching method of claim 35, wherein:
the forming of the substrate feature comprises forming a layer comprising a nitride material; and
the forming of the overlying layer of material comprises forming a layer comprising doped oxide.

41. The etching method of claim 40 wherein the nitride material comprises silicon nitride.

42. The etching method of claim 40 wherein the etching of the layer of material comprises using an etch chemistry comprising $C_2HF_5$, $CHF_3$, and $CH_2F_2$.

43. The etching method of claim 40 wherein the etching of the layer of material comprises using an etch chemistry comprising $C_2HF_5$, $CHF_3$, and $CH_2F_2$ having a volume ratio of about 1:3:4.

44. An etching method comprising:
forming a substrate feature over a substrate, the feature having a portion which is to be exposed by etching an overlying layer of material;
forming an overlying layer of material over the substrate feature;
patterning an opening over the substrate feature portion, the opening having a dimension which is larger in area than an area of the feature portion which is to be exposed;
selectively etching the layer of material through the opening relative to material from which the feature is formed, the etching comprising using a dual source, high density plasma etcher having:
 a planar inductive coil powered at no greater than about 300 Watts:
 a bias power no greater than about 300 Watts; and
 an etcher pressure from between about 10 mTorr to 20 mTorr;
the forming of the substrate feature comprising forming a layer comprising undoped oxide;
the forming of the overlying layer of material comprising forming a layer comprising doped oxide; and
the etching of the layer of material comprising using an etch chemistry comprising $C_2HF_5$, $CHF_3$, and $CH_2F_2$.

45. An etching method comprising:
forming a substrate feature over a substrate, the feature having a portion which is to be exposed by etching an overlying layer of material;
forming an overlying layer of material over the substrate feature;
patterning an opening over the substrate feature portion, the opening having a dimension which is larger in area than an area of the feature portion which is to be exposed;
selectively etching the layer of material through the opening relative to material from which the feature is formed, the etching comprising using a dual source, high density plasma etcher having:
 a planar inductive coil powered at no greater than about 300 Watts;
 a bias power no greater than about 300 Watts; and an etcher pressure from between about 10 mTorr to 20 mTorr:
the forming of the substrate feature comprising forming a layer comprising undoped oxide;
the forming of the overlying layer of material comprising forming a layer comprising doped oxide; and
the etching of the layer of material comprising using an etch chemistry comprising $C_2HF_5$, $CHF_3$, and $CH_2F_2$ having a volume ratio of about 1:3:4.

46. An etching method comprising:
forming a first oxide-comprising layer over a substrate;
forming a second layer comprising a material which is different from the first oxide-comprising layer, over the first oxide-comprising layer; and
etching the second layer selectively relative to the first layer using a dual source, high density plasma etcher having an inductive source driven at a power less than about 200 Watts, and with an etchant selected from a group of compounds comprising both hydrogen and fluorine.

47. The etching method of claim 46, wherein the first layer comprises undoped oxide and the second layer comprises doped oxide.

48. The etching method of claim 46, wherein the etching of the second layer comprises etching the layer at a rate of at least about 4000 Angstroms/minute.

49. The etching method of claim 46, wherein the inductive source comprises a generally planar coil.

50. An etching method comprising:
forming a first oxide-comprising layer over a substrate;
forming a second layer comprising a material which is different from the first oxide-comprising layer, over the first oxide-comprising layer; and
etching the second layer selectively relative to the first layer using a dual source, high density plasma etcher having an inductive source driven at a power less than about 200 Watts, and with an etchant selected from a group of compounds comprising both hydrogen and fluorine, the group of compounds comprising $C_2HF_5$, $CHF_3$, and $CH_2F_2$.

51. An etching method comprising:
forming a first oxide-comprising layer over a substrate;
forming a second layer comprising a material which is different from the first oxide-comprising layer, over the first oxide-comprising layer; and
etching the second layer selectively relative to the first layer using a dual source, high density plasma etcher having an inductive source driven at a power less than about 200 Watts, and with an etchant selected from a group of compounds comprising both hydrogen and fluorine, the group of compounds comprising $C_2HF_5$, $CHF_3$, and $CH_2F_2$ having a volume ratio of about 1:3:4.

* * * * *

UNITED STATES PATENT AND TRADEMARK OFFICE
CERTIFICATE OF CORRECTION

PATENT NO : 6,117,788
DATED : September 12, 2000
INVENTOR(S) : Kei-Yu Ko

It is certified that error appears in the above-identified patent and that said Letters Patent are hereby corrected as shown below:

Col. 5, line 30
  replace "10"
  with --16--.

Signed and Sealed this

First Day of May, 2001

Attest:

NICHOLAS P. GODICI

Attesting Officer    Acting Director of the United States Patent and Trademark Office